(12) United States Patent
Miura et al.

(10) Patent No.: US 6,326,284 B1
(45) Date of Patent: *Dec. 4, 2001

(54) SEMICONDUCTOR DEVICE AND PRODUCTION THEREOF

(75) Inventors: Hideo Miura, Koshigaya; Shuji Ikeda, Koganei; Norio Suzuki, Higashimurayama; Yasuhide Hagiwara, Fuchu; Hiroyuki Ohta, Tsuchiura; Asao Nishimura, Kokubunji, all of (JP)

(73) Assignee: Hitachi, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/610,488

(22) Filed: Mar. 4, 1996

(30) Foreign Application Priority Data

Mar. 8, 1995 (JP) ..................................... 7-048106

(51) Int. Cl.$^7$ ................................. H01L 21/76
(52) U.S. Cl. .................... 438/452; 438/439; 438/308; 438/795
(58) Field of Search .................... 438/452, 772, 438/773, 774, 795, 308, 439

(56) References Cited

U.S. PATENT DOCUMENTS 3,853,633 * 12/1974 Armstrong ........................ 438/217
5,045,492   9/1991 Huie et al. .
5,132,244 *  7/1992 Roy ..................................... 438/774
5,151,381 *  9/1992 Liu et al. ............................. 438/452
5,210,056 *  5/1993 Pong et al. .......................... 438/773
5,290,718   3/1994 Fearon et al. .
5,637,528 *  6/1997 Higashitani et al. ................ 438/452

FOREIGN PATENT DOCUMENTS

| 0214421 | 3/1987 | (EP) . |
| 57207366 | 12/1982 | (JP) . |
| 58039014 | 3/1983 | (JP) . |
| 62094926 | 5/1987 | (JP) . |
| 03257828 | 11/1991 | (JP) . |
| 04316332 | 11/1992 | (JP) . |
| 05267333 | 10/1993 | (JP) . |

OTHER PUBLICATIONS

Patent Abstract of Japan—Publication No. 01255228—Publication Date Oct. 1989.

Patrice Deroux–Dauhphin er al.: "Physical and electrical characterization of a SILO Isolation structure", *IEEE Transactions On Electron Devices*, vol. ED–32, No. 11, Nov. 1985, pp. 2392–2398.

* cited by examiner

Primary Examiner—Trung Dang
(74) Attorney, Agent, or Firm—Antonelli, Terry, Stout & Kraus, LLP

(57) ABSTRACT

A semiconductor device produced by forming an oxide film on a substrate, heat treating the oxide film at a temperature of 800° C. or higher in an inert atmosphere, followed by conventional steps for formation of a transistor, is improved in electrical reliability due to relaxation of stress generated in the oxide film or in the surface of substrate.

7 Claims, 10 Drawing Sheets

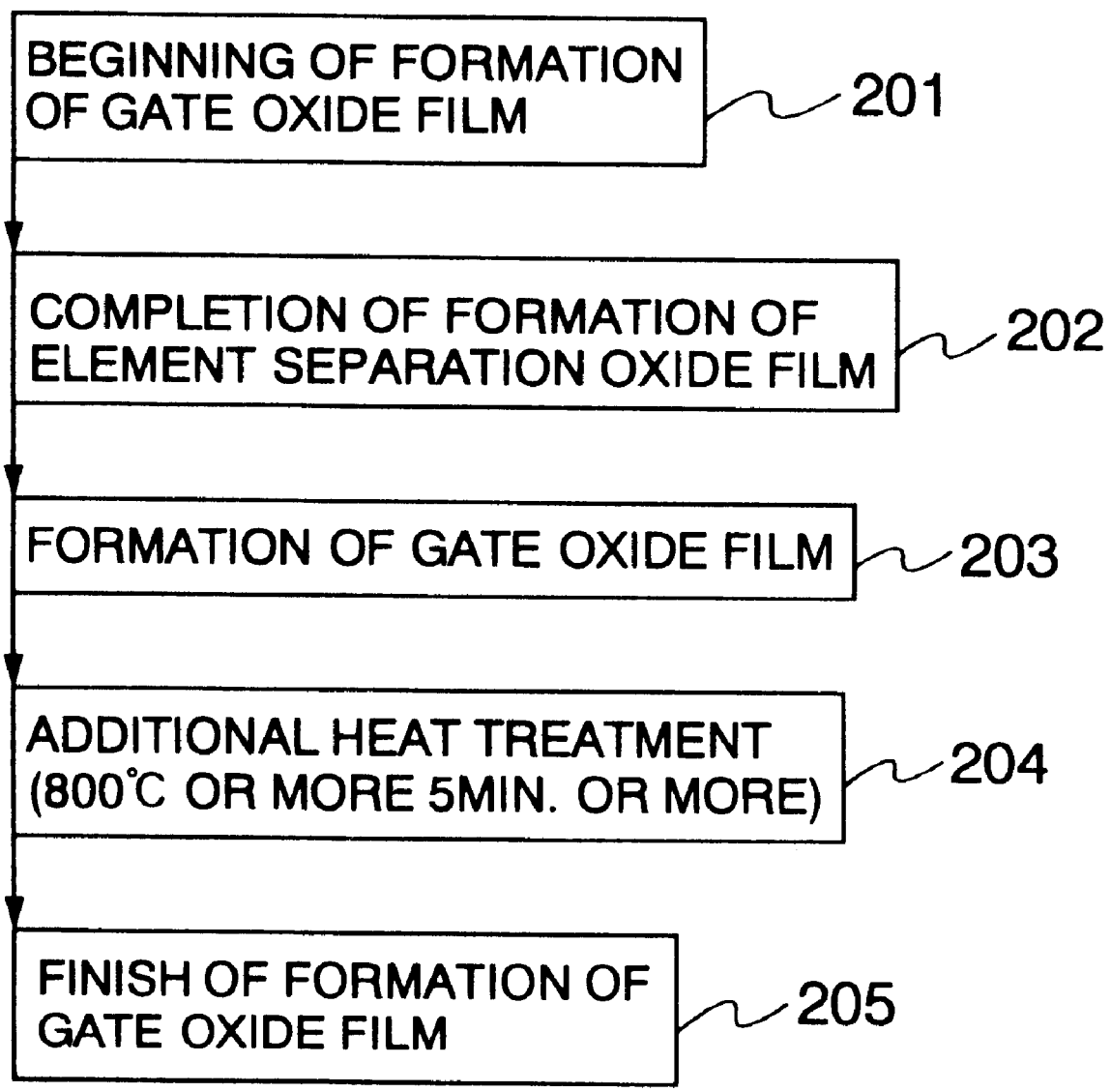

SEMICONDUCTOR DEVICE AND PRODUCTION THEREOF

BACKGROUND OF THE INVENTION

This invention relates to a semiconductor device and process for producing the same, and particularly to a process for producing a semiconductor device suitable for forming a thermal oxide film and a semiconductor device obtained by said process.

In the production of semiconductor elements using silicon as a substrate, silicon oxide film formed by thermal oxidation of silicon is used as an insulating film. In the process of forming this thermal oxide film, a silicon-oxygen bonding is formed while cleaving silicon-silicon bonding, due to which a great strain (stress) appears in the vicinity of interface between silicon and oxide film.

Since molecular volume of silicon oxide is twice or more as great as that of silicon, the oxide film formed by oxidation reaction tends to expand, due to which a tensile stress appears in the silicon side and a compressive stress arises in the oxide film side, usually. When stresses become great, crystal defects such as dislocation and the like appear in the silicon substrate which is a single crystal. In semiconductor elements, the presence of such crystal defects causes leakage current and greatly deteriorates reliability of article.

Even if no crystal defect appears in silicon substrate, the stress arising in the oxide film can strain the atomic distance in the oxide film and thereby lower the atomic bonding forces and, in some extreme cases, cause injuries such as breakage of atomic bondings. If such an injury appears, insulating characteristics of oxide film are deteriorated, and electrical reliability of oxide film and article decreases.

Generally speaking, the value of stress monotonously increases as thickness of the formed oxide film increases. Accordingly, when a thick thermal oxide film is to be formed, relaxation of the stress is an important problem. As a method for relaxing the stress, JP-A-3-11733 proposed a method of once interrupting the thermal oxidation, carrying out a heat treatment to eliminate strains, and thereafter again continuing the thermal oxidation.

From the viewpoint of mechanism for generating stress in oxide film, the stresses can be classified into a stress caused by the volume expansion of oxide film in the vicinity of silicon/oxide film interface brought about by the oxidation reaction in the oxide film-forming process and a stress generated from the thin films deposited on oxide film.

Although the stress caused by oxidation reaction can be relaxed to some extent according to prior technique, there has hitherto been no effective method for relaxing the stress generated from the thin films deposited on oxide film. Said "stress generated from the thin films deposited on oxide film" is generated according to the following process.

First, as the process of formation of oxide film, there can be referred to a process of partially forming the elements-separating oxide film up to a thickness of about several thousands angstroms for the purpose of electrically insulating and isolating the elements, such as transistors, adjacently placed on a silicon substrate. As a method for forming such an element-separating oxide film, the selective oxidation method is widely utilized (cf. FIG. 2). According to the selective oxidation method, a silicon nitride film 3 (FIG. 2C) is deposited on a silicon substrate 1 (FIG. 2A) through intermediation of a thin thermal oxide film called "pad oxide film 2" (FIG. 2B), and then the silicon nitride film 3 is etched off from the region on which an element-separating oxide film is to be formed (FIG. 2D) and the whole is oxidized to form a thick oxide film partially on the silicon substrate (FIG. 2E).

In this selective oxidation method, the silicon nitride film used as an oxidation-preventing film has an internal stress of about 1,000 MPa at the time of depositing the films, in many cases, and this stress acts upon the oxide film, too. Further, in the process of selective oxidation, oxidizing species such as oxygen and $H_2O$ three-dimensionally diffuse in the silicon substrate, as a result of which oxide film 5 called "bird's beak" grows in the vicinity of the edge of silicon nitride film.

Since volume of an oxide film expands in the growing period of the oxide film, edge of the silicon nitride film is lifted, and a warping deformation appears in the whole film. Reaction forces cause by this warping deformation are concentrated into the edges of silicon nitride, and a great stress appears in the oxide film at the edges of silicon nitride film. This concentration of stress takes place without fail to injure the oxide film when a silicon nitride film exists.

Another process through which the thin film deposited on oxide film injures the oxide film is the process of depositing a thin film as a gate electrode on the gate oxide film of MOS (metal oxide semiconductor) type transistor. As the gate electrode, polycrystalline silicon thin film, high-melting metallic material or silicide alloy thin film is used either in the form of single layer or in a laminate structure.

Such a gate electrode material is often deposited with an internal stress exceeding several hundreds or one thousand MPa. Thus, when a gate electrode is fabricated, the internal stress is concentrated into the oxide film in the vicinity of edge parts of gate electrode, and thereby the oxide film is injured.

SUMMARY OF THE INVENTION

It is an object of this invention to provide a process for producing a semiconductor device capable of remedying the injury of oxide film at the edge parts of thin film partially deposited on oxide film, and a semiconductor device obtained by said process.

This invention provides a process for producing a semiconductor device which comprises forming a thermal oxide film on a silicon substrate, carrying out a heat-treatment in an inert atmosphere at a temperature of not lower than 800° C. while keeping the surface of the oxide film or silicon substrate in a bare state (the term "bare" means that the surface is not covered with other film), followed by introduction of impurities, formation of electrodes and wiring, formation of an insulating film and, if necessary, formation of the wiring of second layer so as to form a transistor.

This invention further provides a process for producing a semiconductor device which comprises, after completing the selective oxidation for forming an oxide film partially having a partially increased thickness on the surface of a silicon substrate for electrically insulating and isolating semiconductor elements, removing the thin films other than the oxide film, carrying out a heat-treatment in an inert atmosphere at a temperature of not lower than 950° C. while keeping the surface of oxide film or silicon substrate in a bare state, followed by formation of a gate oxide film, introduction of impurities, formation of electrodes and wiring, formation of insulating film and, if necessary, formation of the wiring of second layer so as to form a transistor.

This invention further provides a process for producing a semiconductor which comprises, after forming an oxide film having a partially increased thickness on a silicon substrate for electrically insulating and isolating semiconductor elements, forming a gate oxide film of MOS type transistor and, just after completing the gate oxidation or after forming the gate electrodes, carrying out a heat-treatment in an inert atmosphere at a temperature not lower than 800° C., followed by introduction of impurities, formation of electrodes and wiring, formation of insulating film and, if necessary, formation of the wiring of second layer so as to form a transistor.

This invention further provides semiconductor devices produced according to the above-mentioned processes.

BRIEF DESCRIPTION OF THE DRAWINGS

FIG. 6 is a flow chart illustrating the production process of Example 2 of this invention.

DESCRIPTION OF THE PREFERRED EMBODIMENTS

Figure 1A:
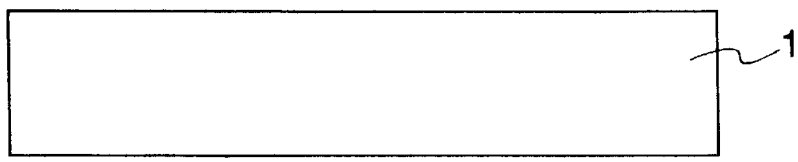
FIGS. 1A to 1F are each schematic diagram illustrating the cross-sectional structural change in the first embodiment (Example 1) of this invention.

For remedying the injury in oxide film, it is effective to carry out a heat-treatment in an inert atmosphere at a temperature of not lower than 800° C. preferably for at least 5 minutes and further preferably for at least 20 minutes while keeping the surface of oxide film in a bare state as possible, namely without covering it with other films. The temperature of the heat-treatment is 1,410° C. (below the melting point of silicon substrate) or below, and preferably 1,250° C. or below, and more specifically about 1,200° C. In the process of forming an element-separating oxide film by the selective oxidation method, the silicon nitride films or the polycrystalline silicon thin films used as oxidation-preventing films are exhaustively removed after completion of the selective oxidation, and the remainder is heat-treated at a temperature not lower than 800° C. and preferably not lower than 950° C., and not higher than 1,410° C. and preferably not higher than 1,200° C., for at least 5 minutes and preferably for at least 30 minutes, while keeping the surface of oxide film or silicon substrate in a bare state. Further, after completing the heat-treatment succeeding to the formation of element-separating oxide film, and after forming the gate oxide film of MOS type transistor, additional heat-treatments are carried out at a temperature not lower than 800° C. for at least 5 minutes and preferably at least 30 minutes while keeping the surface of oxide film in a bare state. Further, after forming electrodes on the gate oxide film (patterning), too, a heat-treatment is carried out at a temperature of not lower than 800° C. for at least 5 minutes and preferably at least 20 minutes while keeping the gate electrodes and oxide film in a bare state.

Accordingly, the process for producing a semiconductor device of this invention has any one of the following embodiments, and the semiconductor device of this invention can be produced according to any of these production processes.

(1) A process for producing a semiconductor device which comprises forming a thermal oxide film on a silicon substrate, carrying out a heat-treatment in an inert atmosphere at a temperature of not lower than 800° C. for at least 5 minutes while keeping the surface of oxide film or silicon substrate in a bare state, followed by introduction of impurities, formation of electrodes and wiring, formation of an insulating film, and if necessary, formation of the wiring of second layer, etc. so as to form a transistor.

(2) A process for producing a semiconductor device which comprises, after completing the selective oxidation for forming on the surface of silicon substrate an oxide film having a partially increased thickness for electrically insulating and isolating the semiconductor elements, removing the thin films other than the oxide film, carrying out a heat-treatment in an inert atmosphere at a temperature of not lower than 950° C. and not higher than 1,410° C. and preferably not higher than 1,200° C. for at least 5 minutes and preferably for at least 20 minutes while keeping the oxide film or silicon substrate in a bare state, followed by formation of a gate oxide film, introduction of impurities, formation of electrodes and wiring, formation of insulating film, and if necessary, formation of the wiring of second layer, etc. so as to form a transistor.

(3) A process for producing a semiconductor device which comprises forming an oxide film having a partially increased thickness on the surface of a silicon substrate for electrically insulating and isolating the semiconductor elements, thereafter forming a gate oxide film of MOS type transistor and, just after completing the gate oxidation or after forming the gate electrodes, carrying out a heat-treatment in an inert atmosphere at a temperature of not lower than 800° C. and not higher than 1,410° C. and preferably not higher than 1,200° C. for at least 5 minutes and preferably for at least 20 minutes, followed by introduction of impurities, formation of electrodes and wiring, formation of an insulating film, and if necessary, formation of the wiring of a second layer, etc. so as to form a transistor.

(4) A semiconductor device obtained by forming a thermal oxide film on a silicon substrate, subsequently carrying out a heat treatment in an inert atmosphere at a temperature of not lower than 800° C. and not higher than 1,410° C. and preferably not higher than 1,200° C. for at least 5 minutes and preferably for at least 20 minutes while keeping the surface of the oxide film or silicon substrate in a bare state, and then carrying out the steps necessary for formation of a transistor, for example, introduction of impurities, formation of wiring, formation of an insulating film, formation of wiring of a second layer, etc.

(5) A semiconductor device obtained by completing the selective oxidation for forming on the surface of a silicon substrate an oxide film having a partially increased thickness for electrically insulating and isolating semiconductor elements, thereafter removing the thin films other than the oxide film, carrying out a heat-treatment in an inert atmosphere at a temperature of not lower than 950° C. and not higher than 1,410° C. and preferably not higher than 1,200° C. for at least 5 minutes and preferably for at least 20 minutes while keeping the oxide film or silicon substrate in a bare state, and then carrying out the steps necessary for formation of a transistor, for example, formation of gate oxide film, introduction of impurities, formation of electrodes and wiring, formation of insulating film, formation of the wiring of a second layer, etc.

(6) A semiconductor device obtained by forming on the surface of a silicon substrate an oxide film having a partially increased thickness for electrically insulating and isolating semiconductor elements, thereafter forming a gate oxide film of MOS type transistor and, just after completion of the gate oxidation or after formation of gate electrodes, carrying out a heat-treatment in an inert atmosphere at a temperature of not lower than 800° C. and not higher than 1,410° C. and preferably not higher than 1,200° C. for at least 5 minutes and preferably for at least 20 minutes, and then carrying out the steps necessary for formation of a transistor, for example, introduction of impurities, formation of wiring, formation of an insulating film, formation of the wiring of a second layer, etc.

(7) A semiconductor device according to Item (4), (5) or (6), wherein said semiconductor device is a memory device such as flash memory DRAM, SRAM or the like or a processor or a computing device.

(8) A process for producing a semiconductor device according to Item (1), (2) or (3), wherein said thermal oxidation is carried out at least in an atmosphere of a gaseous mixture of hydrogen and oxygen or in an atmosphere of $H_2O$, wherein the mixing ratio of hydrogen/oxygen is less than 2/1 and preferably from about 1.5/1 to about 1.8/1.

(9) A semiconductor device according to Item (4), (5), (6) or (7), wherein said thermal oxidation is carried out at least in an atmosphere of a gaseous mixture of hydrogen and oxygen or in an atmosphere of $H_2O$, wherein the mixing ratio of hydrogen/oxygen in the gaseous mixture is less than 2/1 and preferably from about 1.5/1 to about 1.8/1.

(10) A process for producing a semiconductor device according to Item (1), (2), (3) or (8), wherein the atmosphere of the heat-treatment is nitrogen, hydrogen, an inert gas such as argon or the like or a gaseous mixture of these gases, these gases or gaseous mixtures being able to contain a few percents, preferably 5% or less and further preferably 2% or less, of oxygen.

(11) A semiconductor device according to Item (4), (5), (6), (7) or (9), wherein the atmosphere of the heat-treatment is nitrogen, hydrogen, an inert gas such as argon or the like or a gaseous mixture of these gases, these gases or gaseous mixtures being able to contain a few percents, preferably 5% or less and further preferably 2% or less, of oxygen.

At the time of forming an oxide film on a silicon substrate by the thermal oxidation method, the stress appearing in the oxide film or on the surface of silicon substrate, namely interface with oxide film, varies depending on the temperature of oxidation. This is attributable to the presence of a stress-relaxation process based on the viscoelastic behavior of the thermal oxide film.

Figure 3:
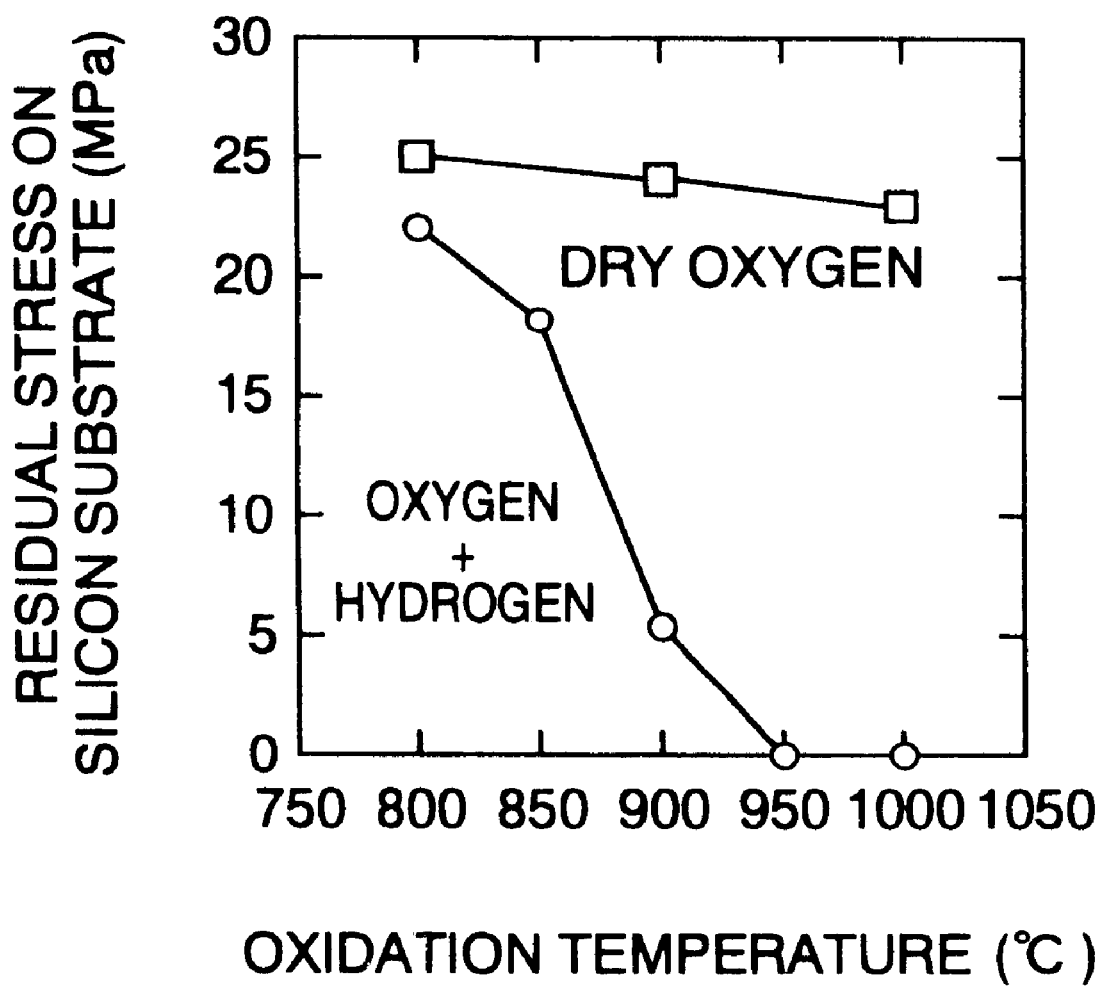
FIG. 3 is a graph illustrating the oxidation temperature-dependence of residual stress in the silicon substrate after thermal oxidation.

FIG. 3 is a result of measurement of the stress appearing on silicon substrate in the process of this thermal oxidation by microscopic Raman spectroscopy, wherein the abscissa denotes the temperature of oxidation and the ordinate denotes the perpendicular stress parallel to the substrate surface remaining at room temperature on the surface of silicon substrate, namely the interface with oxide film. The Figure summarizes the results of measurement in a case where a mixture of hydrogen and oxygen (mixing ratio 1/1.5 to 1/1.8) as atmosphere of oxidation and in another case where dry oxygen is used as the atmosphere. In the oxidation, a single crystal of silicon ((100) surface wafer) is used, and an oxide film having a constant thickness of 50 nm is uniformly formed on the surface of silicon.

It is apparent from the results that the residual stress in silicon substrate monotonously decreases as the temperature of oxidation rises. Relaxation of stress is observed particularly markedly when a gaseous mixture of oxygen and hydrogen is used as atmosphere of oxidation, and the stress decreases approximately to zero at a temperature not lower than 950° C. Such a stress relaxation process is observable not only in the process of progress of oxidation reaction but also when heat-treatment is carried out after completion of oxidation reaction.

That is, in an oxidation atmosphere containing a gaseous mixture of oxygen and hydrogen, the stress of oxide film decreases approximately to zero when an oxide film is formed at 850° C. and then an additional heat-treatment is carried out in an inert atmosphere at 950° C. for 30 minutes. Although the stress relaxation in the process of heat-treatment exhibits an effect in about 5 minutes, the relaxation of stress is preferably carried out for at least 20 minutes in order to achieve a sufficient relaxation.

FIG. 3 illustrates the results of measurement at an oxide film thickness of 50 nm. When the oxide film thickness exceeds about 100 nm, an oxidation at a temperature of 950° C. or above cannot always bring about a decrease of the residual stress in silicon substrate to zero at the time of completion of the oxidation. This is for the reason that the stress relaxation takes a period of time. Accordingly, carrying out the above-mentioned heat-treatment after formation of oxide film by thermal oxidation method is effective for relaxing the stress in oxide film. The mixing ratio of hydrogen/oxygen in the oxygen-hydrogen gaseous mixture is less than 2/1 and preferably from about 1.5/1 to about 1.8/1.

When an oxidation is conducted by using an oxidation-preventing film such as silicon nitride film or the like as in the case of selective oxidation method, the stress is concentrated into the edge parts of oxidation-preventing film as has been mentioned above. Accordingly, the stress generated due to the presence of thin film can also be relaxed together with the oxidation-induced stress by removing the thin film forming a cause of the stress (silicon nitride film in this case) after completion of oxidation and then carrying out an additional heat-treatment in an inert atmosphere while keeping whole surface of the oxide film or silicon substrate in a bare state.

Further, since the gate oxide film of MOS type transistor is mostly formed at about 850° C. and a great stress often remains in the oxide film after the film formation, practice of such an additional heat-treatment is very effective.

When an gate electrode is deposited on the gate oxide film or when deposition of electrode plus etching processing and the like is carried out, too, stress is concentrated into the oxide film of edge parts of gate electrode. In this case, too, the stress generated in the oxide film can be relaxed by carrying out such a heat-treatment in an inert atmosphere after completing the etching processing of gate electrode.

The heat-treatment for the purpose of stress relaxation of the above-mentioned thermal oxide film, oxide film, gate oxide film or the like is preferably carried out in the presence of an inert gas such as nitrogen, hydrogen, argon, helium or the like. Although absence of oxygen is desirable, presence of oxygen in an amount of 5% by volume or less, preferably 2% by volume or less, is allowable.

After the above-mentioned heat-treatment for stress relaxation, the steps necessary for formation of a transistor, such as introduction of impurities, formation of electrodes and wiring, formation of an insulating film, formation of the wiring of a second layer, etc. are carried out in the case of the above-mentioned embodiment (1), in the usual manner, whereby the intended semiconductor device can be produced.

In the above-mentioned embodiment (2), the heat-treatment for stress relaxation is carried out and thereafter the steps necessary for formation of a transistor such as formation of a gate oxide film, introduction of impurities, formation of electrodes and wiring, formation of an insulating film, formation of the wiring of a second layer, etc. are carried in the usual manner, whereby the intended semiconductor device can be produced.

In the above-mentioned embodiment (3), a heat-treatment for stress relaxation is carried out and thereafter the steps necessary for formation of a transistor such as introduction of impurities, formation of electrodes and wiring, formation of an insulating film, formation of the wiring of a second layer, etc. are carried out in the usual manner, whereby the intended semiconductor device can be produced.

Hereinafter, this invention is explained more concretely with reference to Examples.

EXAMPLE 1

Figure 4:
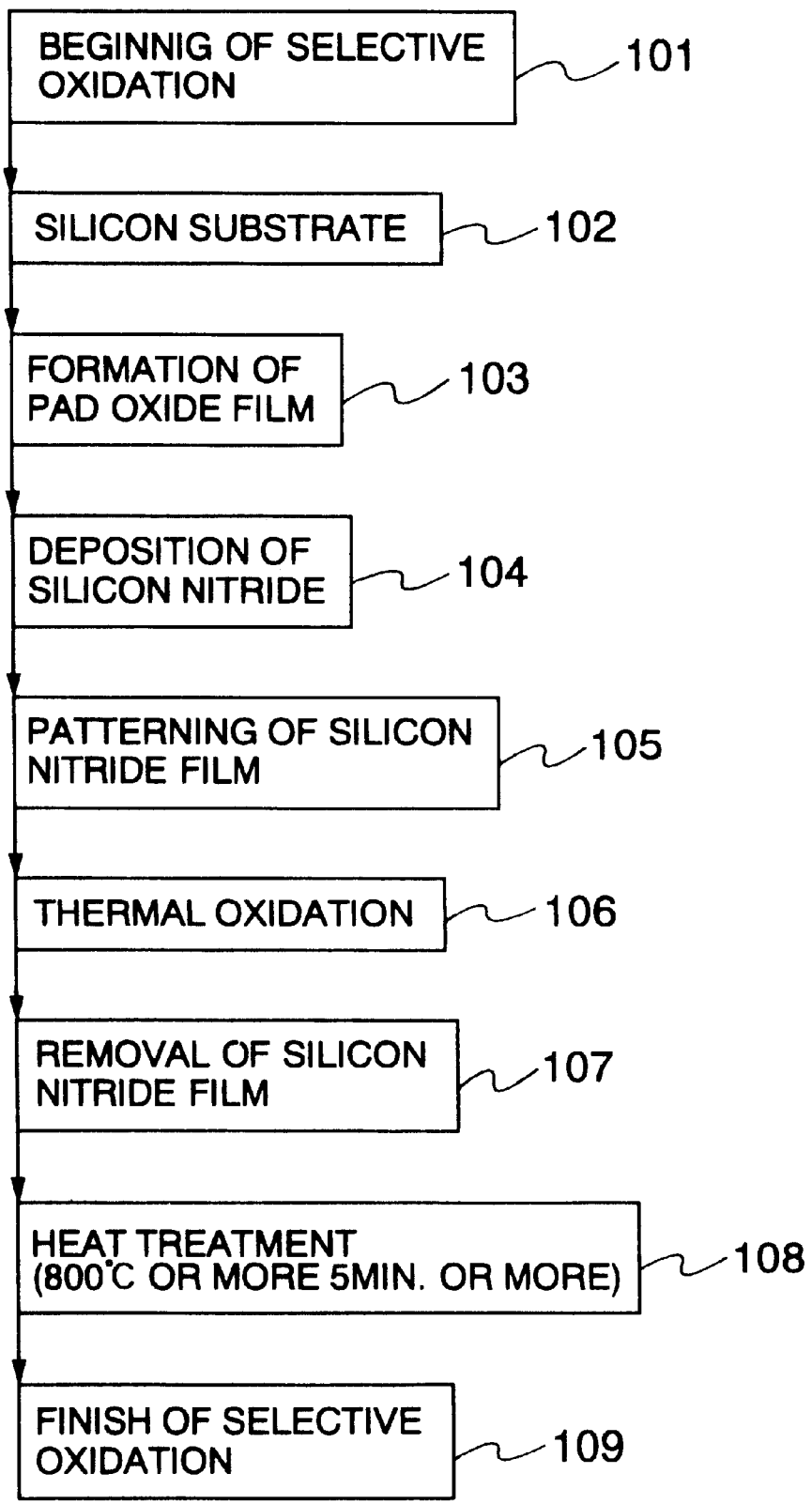
FIG. 4 is a flow chart illustrating the production process in Example 1 of this invention.

Example 1 is explained referring to FIG. 1, FIG. 3 and FIG. 4. FIGS. 1A to 1F are each schematic diagram illustrating the cross-sectional change of silicon substrate in the process of forming an element-separating oxide film using the process of this invention for producing a semiconductor device; FIG. 3 is a graph showing the oxidation temperature-dependence of the stress appearing in the vicinity of silicon substrate surface (interface with oxide film) as oxidation progresses; and FIG. 4 is a flow chart illustrating the process of this Example.

First, according to the flow chart of FIG. 4, this Example is explained referring to FIGS. 1A to 1F. This Example is an application of this invention to a selective oxidation process for forming a thick element-separating oxide film in the production process of semiconductor device.

Figure 1B:
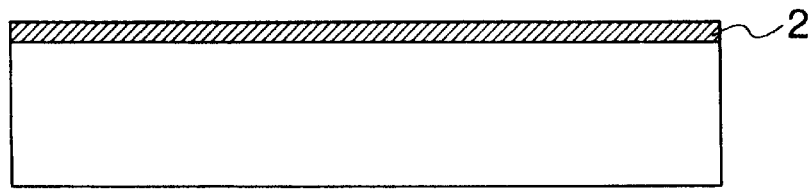
Figure 1C:
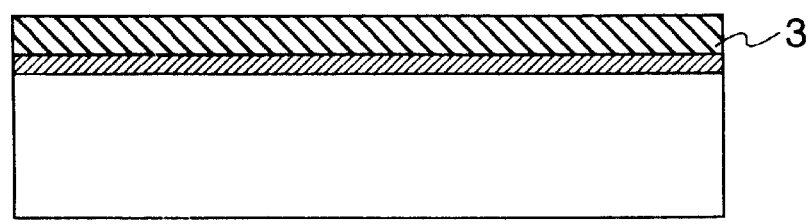
Figure 1D:
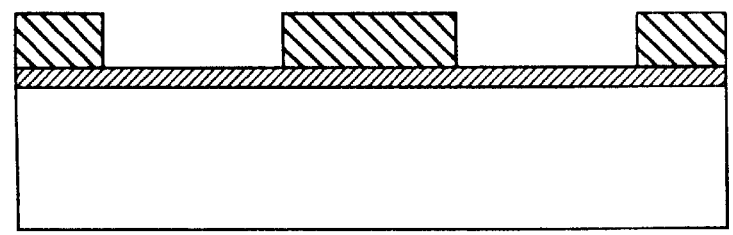
Figure 1E:
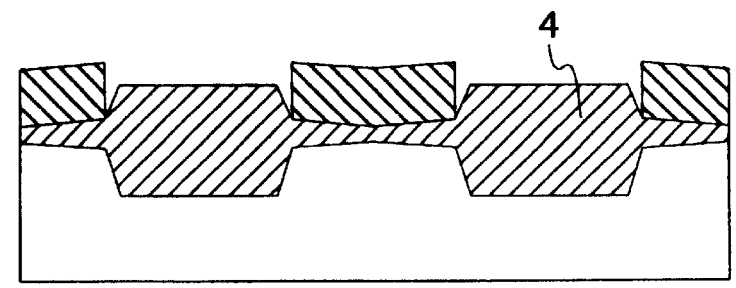
Figure 1F:
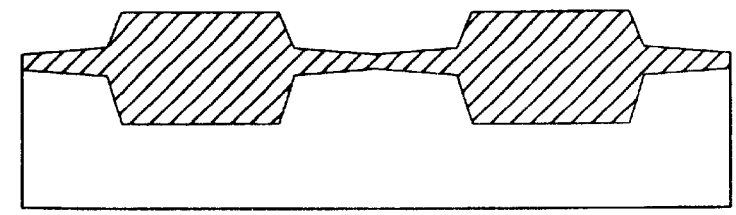
Figure 2A:
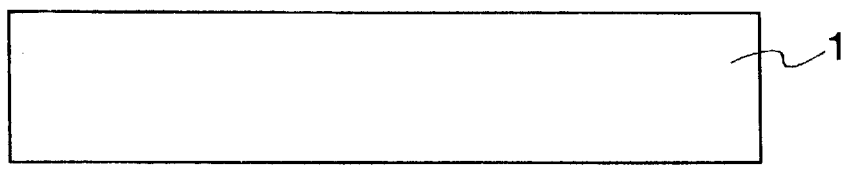
FIGS. 2A to 2E are each schematic diagram illustrating the cross-sectional structural change in the prior art selective oxidation method.
Figure 2B:
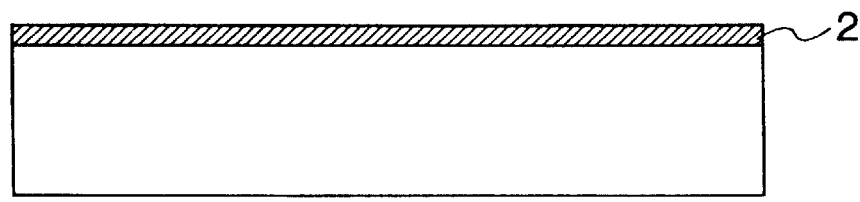
Figure 2C:
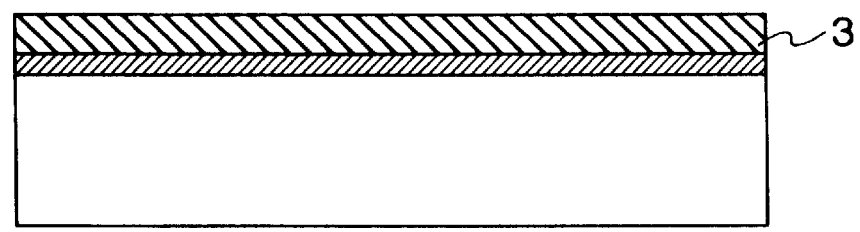
Figure 2D:
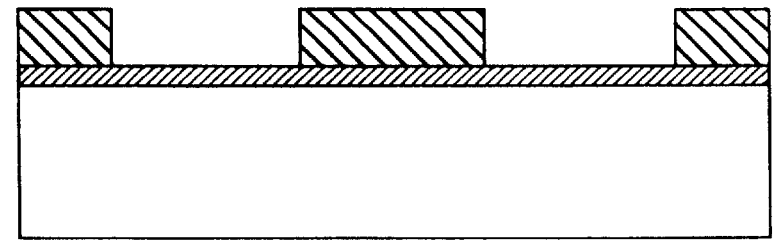
Figure 2E:
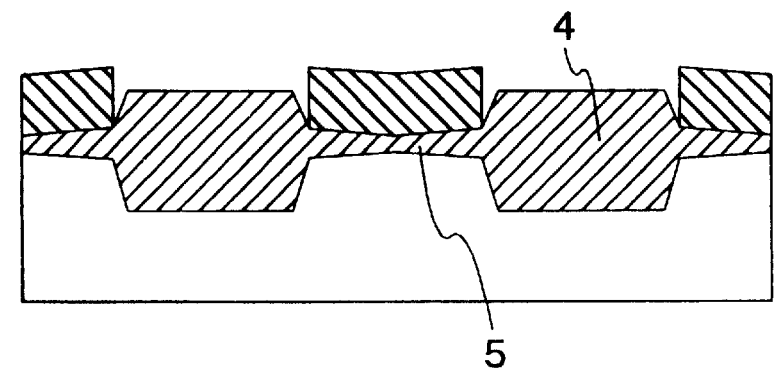

On silicon substrate 1 (FIG. 1A), a thin pad oxide film 2 having a film thickness of about 10 nm is formed by the thermal oxidation method (FIG. 1B). Thereon is deposited a silicon nitride film 3 as an oxidation-preventing film (FIG. 1C). A bare area is formed by etching off the silicon nitride film 3 from the area on which element-separating oxidation film is to be formed, and thermal oxidation is carried out (FIG. 4–106) to form an element-separating oxide film having a film thickness of about 300 to 700 nm (FIG. 1E). Then, the silicon nitride film 3 is wholly removed, and a heat-treatment is carried out at a temperature of not lower than 800° C. for at least 5 minutes and preferably for at least 20 minutes while keeping the oxide film 2 or 3 or silicon substrate 1 in a bare state (FIG. 4–108).

Although the atmosphere of the heat-treatment is an inert gas such as nitrogen, hydrogen, argon or the like or a gaseous mixture of these gases, the atmosphere may contain about 5% or less, preferably 2% or less, of oxygen. Further preferably, temperature of the heat-treatment is not lower than 950° C. and not higher than 1,410° C. and yet preferably not higher than 1,200° C.

The effect of the stress relaxation brought about by this heat-treatment is explained by referring to FIG. 3, wherein the abscissa denotes the temperature of oxidation and the ordinate denotes the residual stress in silicon substrate after the oxidation. The oxidation is carried out with a single crystal of silicon ((100) surface wafer), and an oxide film having a constant thickness of 50 nm is formed uniformly on the silicon surface.

It is apparent that the residual stress in silicon substrate monotonously decreases as the oxidation temperature rises. Relaxation of stress is markedly observed particularly when a gaseous mixture of oxygen and hydrogen is used as the atmosphere of oxidation, and the stress decreases approximately to zero at 950° C. or above. The mixing ratio of hydrogen to oxygen is less than 2/1 by volume, and preferably from about 1.5/1 to about 1.8/1 by volume. Such a stress relaxation behavior is observed not only in the process of progress of oxidation but also when a heat-treatment is carried out after completion of the oxidation reaction. That is, in an oxidation atmosphere containing a mixture of oxygen and hydrogen, the stress in the oxide film can be decreased approximately to zero by forming an oxide film at 850° C. and thereafter carrying out an additional heat-treatment at 950° C. for 30 minutes, too. Although the stress relaxation in the process of heat-treatment exhibits an effect in about 5 minutes, the heat-treatment is preferably carried out for at least 20 minutes in order to attain a sufficient stress relaxation.

FIG. 3 illustrates the results of measurement at an oxide film thickness of 50 nm. When the oxide film thickness exceeds about 100 nm, the residual stress in silicon substrate at completion of oxidation cannot always reach zero, even if the oxidation is carried out at 950° C. or above. This is for the reason that the stress relaxation takes a period of time. Accordingly, carrying out the above-mentioned heat-treatment at 1,000° C. or above and particularly at 1,200° C. after formation of the oxide film by thermal oxidation method is effective for relaxing the stress in the oxide film. Particularly in the selective oxidation method in which stress is concentrated into the oxide film of the vicinity of edge parts of silicon nitride film, the stress generated due to presence of the silicon nitride film can also be relaxed by practicing such a heat-treatment after removal of the silicon nitride film.

In this Example, only a silicon nitride film has been used as the oxidation-preventing film. If desired, however, the oxidation-preventing film may be a film of laminate structure prepared by depositing a silicon nitride film on a polycrystalline silicon thin film. Further, it is not always necessary to form the oxidation-preventing film on the pad oxidation film 2, but it may be formed directly on the silicon substrate 1. When a bare area is formed by partially etching off the oxidation-preventing film (FIG. 4–105 or FIG. 1D), the pad oxide film 2 may also be removed to bare the silicon substrate 1, or it is also allowable to positively etch the silicon substrate 1 down to a depth of about 10 nm or more from the surface to expose the silicon substrate 1 with a level difference.

As mentioned above, this Example exhibits an effect that the oxidation-induced stress or the stress generated in the oxide film due to the presence of oxidation-preventing film in the selective oxidation method can be relaxed, and structure and electrical reliability of oxide film can be improved.

EXAMPLE 2

Figure 5A:
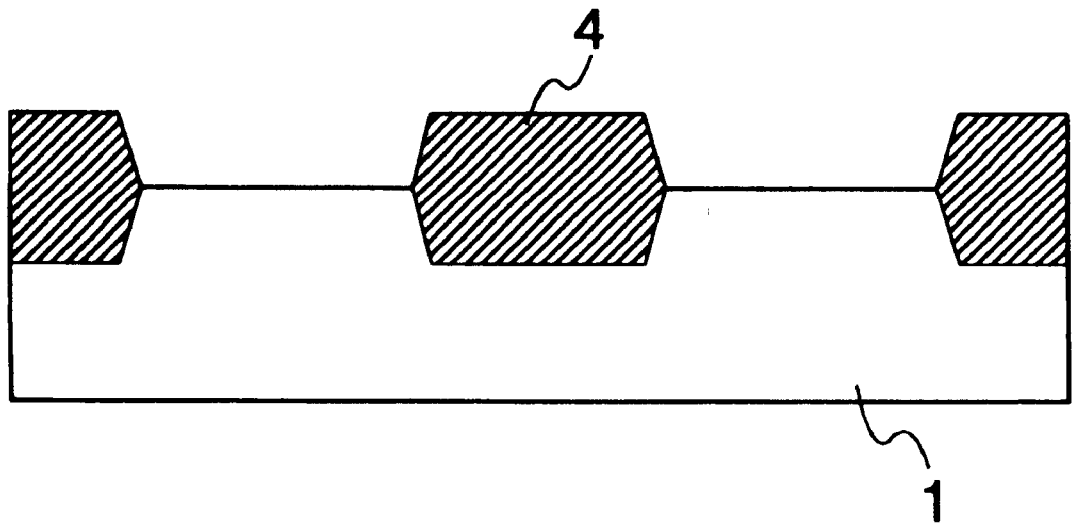
FIGS. 5A and 5B are each schematic diagram illustrating the cross-sectional structural change in Example 2 of this invention.
Figure 5B:
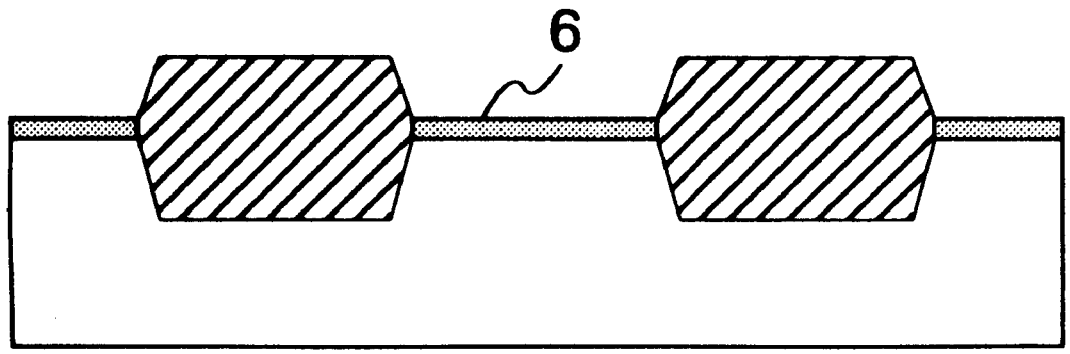

Example 2 is explained herein referring to FIG. 5 and FIG. 6. FIGS. 5A and 5B are each schematic diagram illustrating the cross-sectional change of silicon substrate in the process for forming the gate oxide film for MOS type transistor using the process of this invention; and FIG. 6 is a flow chart illustrating the production process of this Example.

First, this Example is explained referring to FIGS. 5A and 5B, according to the flow chart of FIG. 6. In this Example, a state that an element-separating oxide film 4 has already been formed (FIG. 5A) and the surface of silicon substrate 1 on which gate oxide film is to be formed is bared is taken as an initial state (FIG. 6–202). Preferably, the element-separating oxide film is that formed by the production process mentioned in Example 1, though the method of formation is not limitative.

Gate oxide film 6 is formed on the surface of silicon substrate 1 at a temperature of, for example, 850° C. according to the usual thermal oxidation method (FIG. 5B). After completing the oxidation of gate, a heat-treatment is carried out at a temperature of not lower than 800° C., preferably not lower than 950° C. and not higher than 1,410° C., preferably not higher than 1,200° C., for at least 5 minutes, preferably at least 20 minutes, while keeping the surface of oxide film 4 or 6 in a bare state. Although atmosphere of the heattreatment is an inert gas such as nitrogen, hydrogen, argon or the like or a mixture of these gases, the atmosphere may contain oxygen in an amount of about 5% or less, preferably 2% or less. By this heat-treatment, the oxidation-induced stress generated in the oxide film in the process of forming the gate oxidation film can be relaxed.

This Example exhibits an effect that the stress generated in the oxide film due to the oxidation-induced stress in the gate oxidation process can be relaxed, and structure and electrical reliability of the oxide film can be improved.

EXAMPLE 3

Figure 7A:
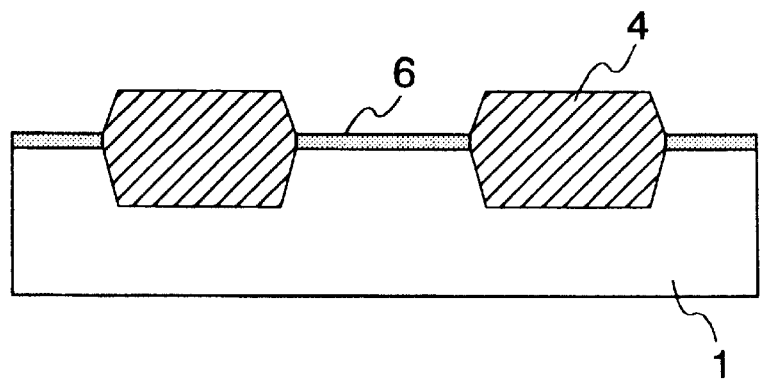
FIGS. 7A to 7C are each schematic diagram illustrating the cross-sectional structural change in Example 3 of this invention.
Figure 7B:
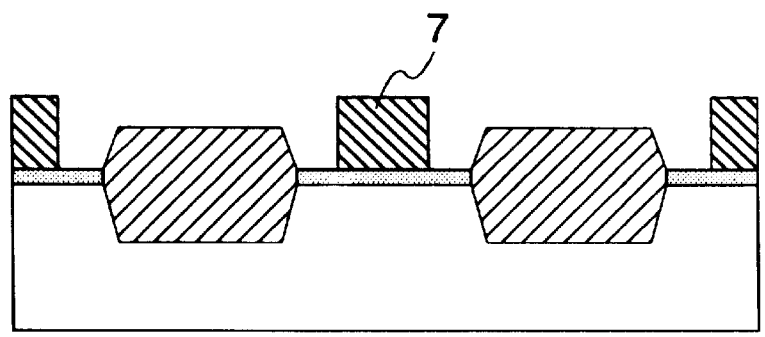
Figure 7C:
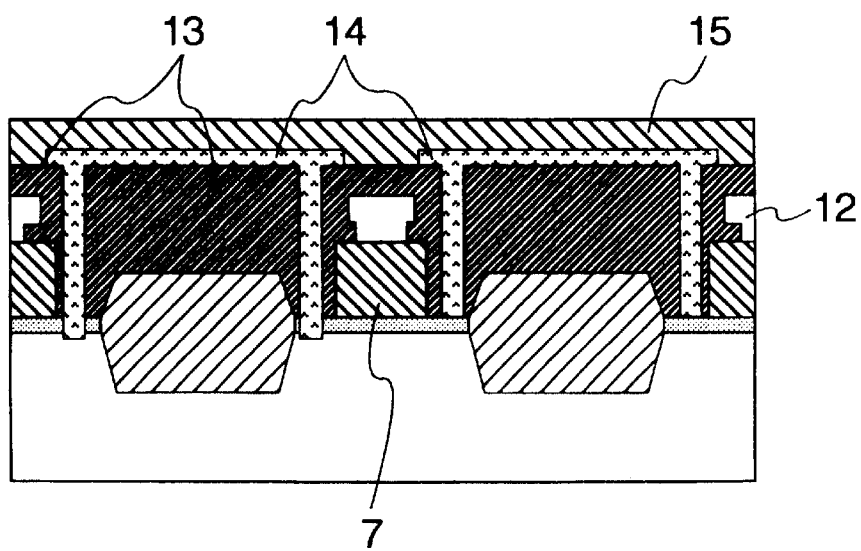
Figure 8:
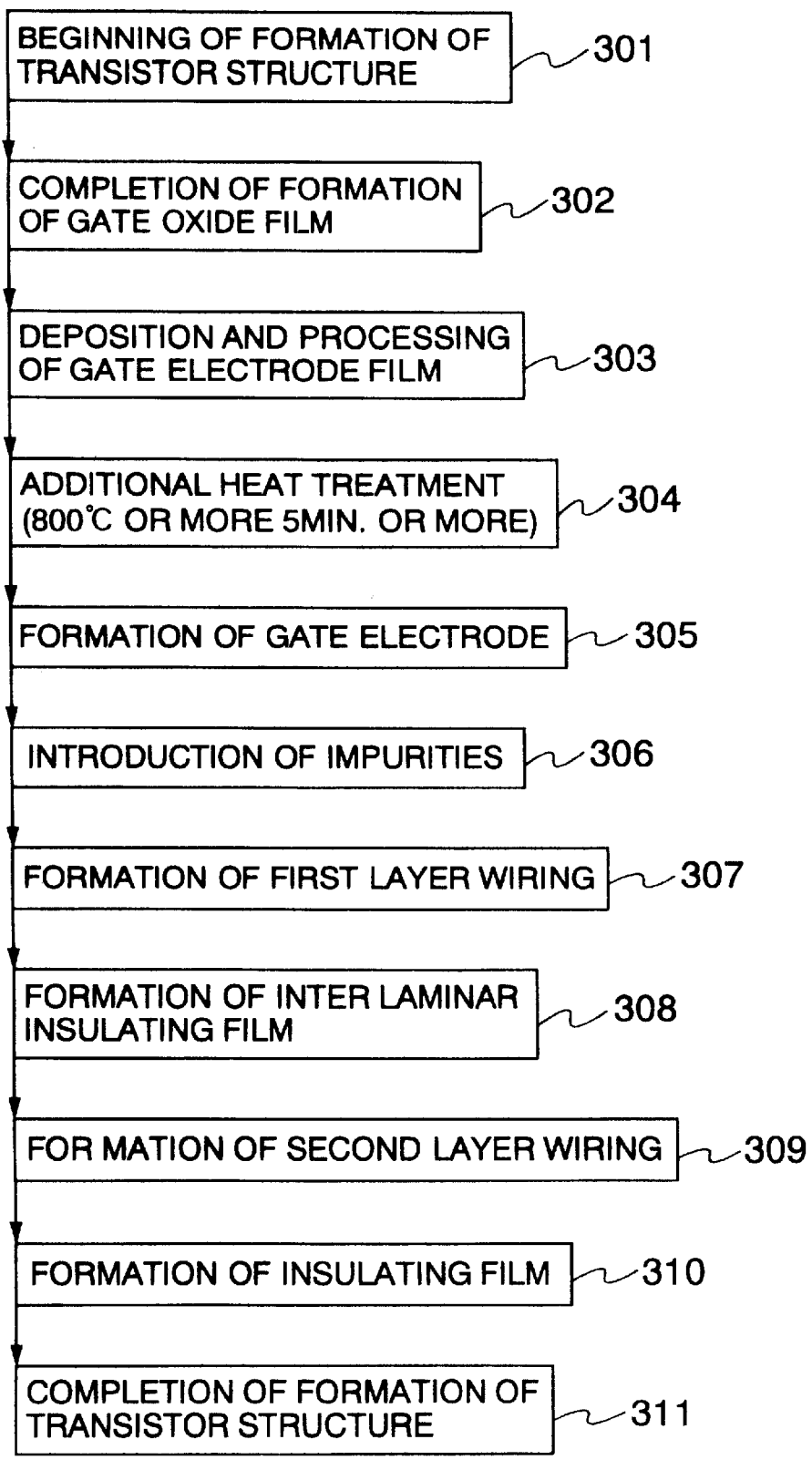
FIG. 8 is a flow chart illustrating the production process of Example 3 of this invention.

Example 3 is explained herein referring to FIG. 7 and FIG. 8. FIGS. 7A to 7C are each schematic diagram illustrating the cross-sectional change of silicon substrate in the process of forming MOS type transistor by the production process of this invention; and FIG. 8 is a flow chart illustrating the process of this Example. According to the flow chart of FIG. 8, this Example is explained referring to FIGS. 7A to 7C. The initial condition of this Example is that gate oxide film 6 of MOS type transistor has already been formed (FIG. 7A, FIG. 8–302).

The formation of element-separating oxide film 4 and gate oxide film 6 in this Example is preferably according to Example 1 and Example 2 of this invention, though this is not limitative. As gate electrode 7, a polycrystalline silicon thin film is formed, for example, which is then processed into a shape of electrode by an etching process (FIG. 7B). Since stress is concentrated into the gate oxide film 6 of the vicinity of the edges of gate electrode 7 in this case, a heat-treatment is carried out at a temperature of not lower than 800° C., preferably not lower than 950° C., and not higher than 1,410° C., preferably not higher than 1,200° C., for at least 5 minutes and preferably at least 20 minutes, for the purpose of remedying the damage which the oxide film has suffered (FIG. 8–304). Although the atmosphere of the heat-treatment is an inert gas such as nitrogen, hydrogen, argon or the like or a mixture of these gases, the atmosphere may contain about 5% or less, preferably 2% or less, of oxygen.

The material constituting the gate electrode is not limited to polycrystalline silicon thin film, but high-melting metallic materials such as tungsten or silicide alloys of high-melting metals, titanium, cobalt, nickel, tungsten or the like, and laminated structures made of thin films of the above-mentioned materials can also be used as a gate electrode material.

Subsequently, the steps necessary for formation of a transistor, for example, introduction of impurities (306), formation of the wiring of first layer 12 (307), formation of interlaminar insulating film 13 (308), formation of the wiring of second layer 14 (309), formation of insulating film 15, etc. are carried out to complete a MOS type transistor (311). FIG. 7C is an example of the cross-sectional structure of a transistor formed by the procedure mentioned herein. The procedure of transistor formation is not limited to that expressed by this flow chart, and the number of wiring layers is not limited to two. The MOS transistor obtained herein may be used in a memory circuit such as DRAM (Dynamic Random Access Memory), SRAM (Static Random Access Memory) and the like or in a computing processor.

This Example has an effect that the stress generated in the gate oxide film due to the internal stress of gate electrode film in the process for forming MOS type transistor can be relaxed, and thereby the electrical reliability of oxide film and transistor can be improved.

EXAMPLE 4

Figure 9A:
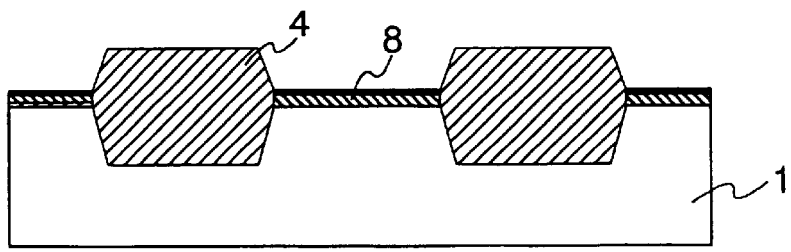
FIGS. 9A to 9E are each schematic diagram illustrating the cross-sectional structural change in Example 4 of this invention.
Figure 9B:
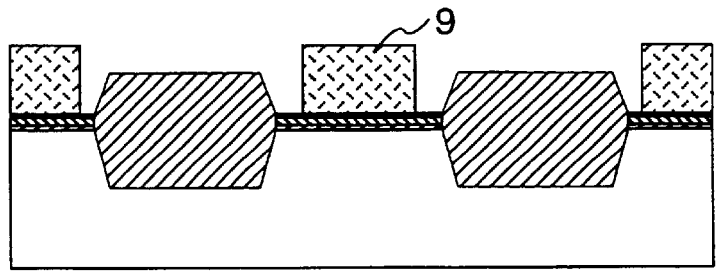
Figure 9C:
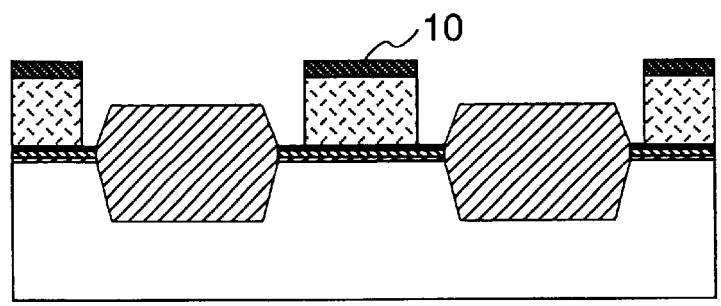
Figure 9D:
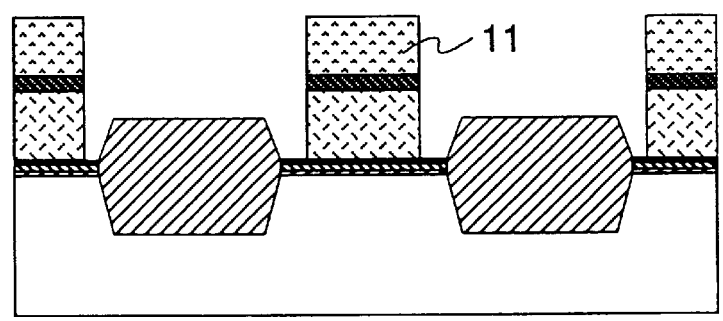
Figure 9E:
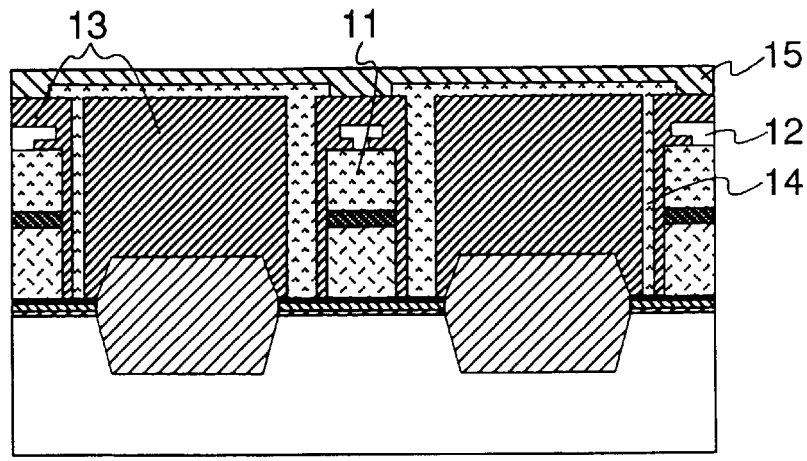
Figure 10:
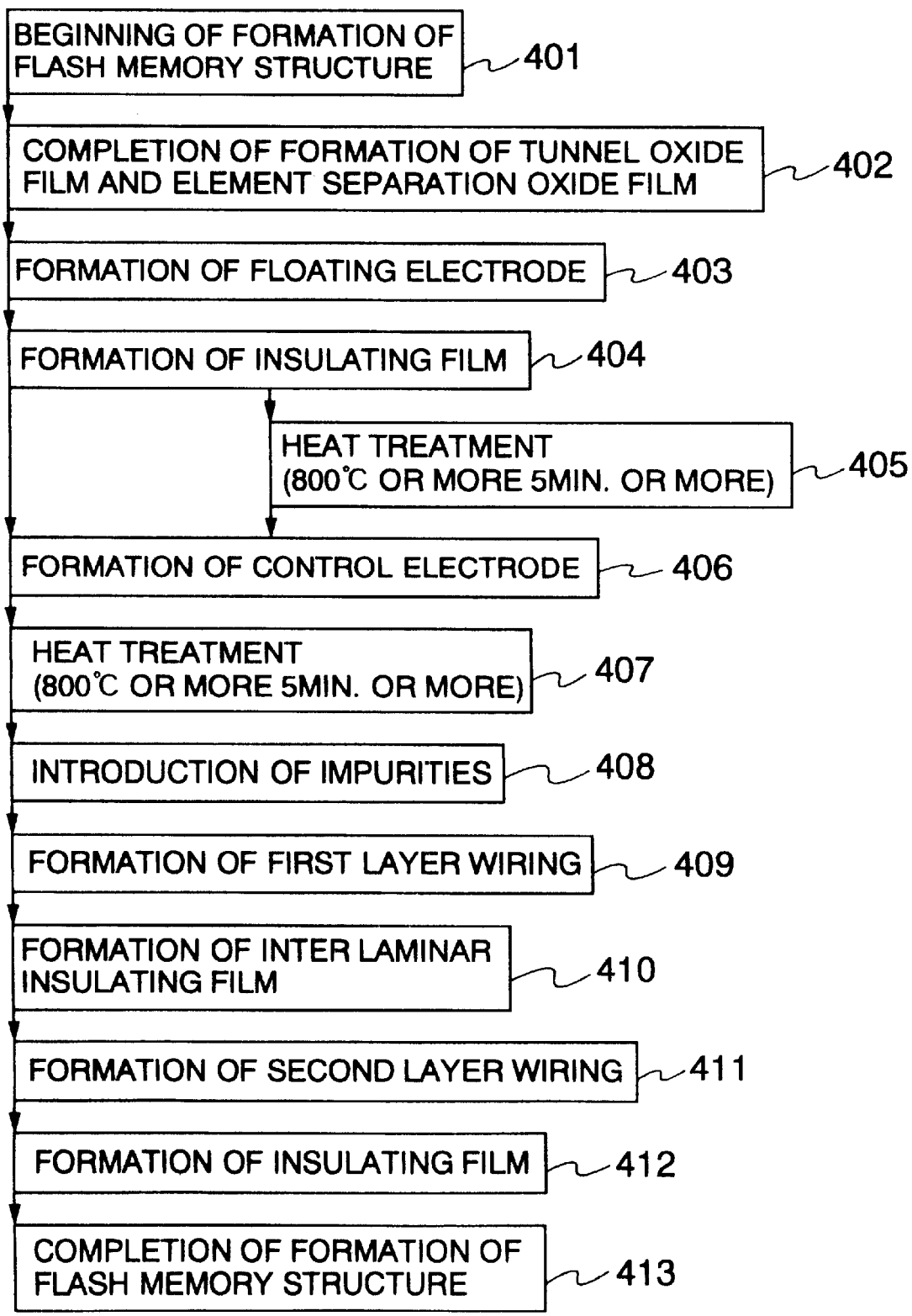
FIG. 10 is a flow chart illustrating the production process of Example 4 of this invention.

Example 4 is explained herein referring to FIG. 9 and FIG. 10. FIGS. 9A to 9E are each schematic diagram illustrating the cross-sectional change of silicon substrate in the process of forming a flash memory structure by the process of this invention; and FIG. 10 is a flow chart illustrating the process of this Example.

First, according to the flow chart of FIG. 10, this Example is explained referring to FIGS. 9A to 9E. The initial state of this Example is a state that an element-separating oxide film 4 and a tunnel oxide film 8 are formed on silicon substrate 1 (FIG. 9A, FIG. 10–402). Said element-separating film 4 and tunnel oxide film are preferably formed by the method mentioned in Example 1 and Example 2 of this invention, though this is not limitative.

On the tunnel oxide film 8 is deposited a thin film for use as a floating gate electrode, which is processed by etching into a floating gate electrode 9 (FIG. 9B). The material constituting the floating gate electrode 9 may be any of polycrystalline silicon, high-melting metallic materials, silicide alloys of high-melting metals, titanium, cobalt, nickel, tungsten and the like and laminate structures made of thin films of the above-mentioned materials. After forming the floating gate electrode, a heat-treatment may be carried out, if desired, for the purpose of relaxing the electrode-caused stress mentioned in Example 3.

Subsequently, an insulating film 10 constituted of a silicon oxide film, a silicon nitride film or a laminate structure thereof is formed on the floating gate electrode 9. If desired, a heat-treatment may be carried out subsequently for the purpose of relaxing the stress appearing at the time of forming this insulating film (FIG. 10–405), provided that this heat-treatment is not always necessary. Next, a controlling gate electrode 11 is formed on the insulating film 10 (FIG. 9D). The material constituting the controlling gate electrode may be any of polycrystalline silicon, high-melting metallic materials, silicide alloys of high-melting metallic materials, titanium, cobalt, nickel, tungsten and the like and laminate structures made of thin films of these materials.

After forming the electrode, a heat-treatment is carried out at a temperature of not lower than 800° C., preferably not lower than 950° C., and not higher than 1,410° C., preferably not higher than 1,200° C., for at least 5 minutes, preferably for at least 20 minutes (FIG. 10–407). The atmosphere of the heat-treatment is preferably an inert gas such as nitrogen, hydrogen, argon or the like, or a gaseous mixture of these gases, though the atmosphere may contain about 5% or less, preferably 2% or less, of oxygen. By this heat-treatment, the stress appearing in the insulating film 10 due to formation of controlling gate electrode 11, the stress appearing in the process of forming the insulating film and the stress appearing in the tunnel oxide film due to formation of floating gate electrode can be relaxed.

Subsequently, the steps necessary for forming a flash memory structure, for example, introduction of impurities (408), formation of the wiring of a first layer 12 (409), formation of an interlaminar insulating film 13 (410), formation of the wiring of a second layer 14 (411), formation of an insulating film 15 (412), etc. are carried out to complete a flash memory structure (413). FIG. 9E illustrates an example of the cross-sectional structure of transistor formed by this procedure, provided that the procedure for forming the transistor is not limited to that expressed by the flow chart and the number of wiring layers is not limited to two. Further, the structure of electrodes constituting the flash memory is not limited to that of this Example.

This Example has an effect that the stress appearing in the insulating films located between the tunnel oxide film or floating gate electrode and controlling gate electrode due to the internal stress of controlling electrode or floating gate electrode in the process of forming a flash memory structure can be relaxed, and thereby the electrical reliabilities of oxide film, insulating film and flash memory can be improved.

According to this invention, the injury of oxide film appearing in the thermal oxide film-forming process of a semiconductor device or the injury of oxide film due to the concentration of stresses at the edge part of thin film partially deposited on the oxide film or the insulating film having a laminate structure of an oxide film and a silicon nitride film can be remedied, and therefore this invention has an effect that structure and reliability of oxide film or insulating film can be improved. Further, this invention has an effect that reliability of semiconductor memory articles such as MOS type transistor, flash memory and the like can be improved.

What is claimed is:

1. A process for producing a semiconductor device, which comprises:

forming a thermal oxide film on a silicon surface of a substrate, after said forming the thermal oxide film, carrying out a heat treatment at a temperature not lower than 800° C. while keeping the oxide film and exposed silicon surface in an inert atmosphere, forming a gate oxide film, after said formation of the gate oxide film, introducing impurities, forming electrodes and wiring, and forming an insulating film, so as to form a transistor.

2. A process for producing a semiconductor device which comprises forming an element-separating oxide film on a silicon substrate, and thereafter carrying out a heat-treatment at a temperature of not lower than 800° C. while keeping a surface of the oxide film or silicon substrate in a bare state in an inert atmosphere, followed by formation of a gate oxide film, introduction of impurities, formation of electrodes and wiring, and formation of an insulating film so as to form a transistor, wherein the oxide film is formed at 850° C. and said heat treatment is carried out at 950° C. for 30 minutes, so as to reduce stress in the oxide film to substantially zero.

3. A process for producing a semiconductor device, which comprises the steps of:

oxidizing a main surface of a semiconductor substrate, forming an oxidation-preventing film on portions of the oxidized surface, so as to provide a resulting surface, oxidizing the resulting surface, removing the oxidation-preventing film, and after said removing, carrying out a heat treatment at a temperature of 800° C. or higher in an inert atmosphere, which further comprises forming a gate oxide film on the heat-treated silicon substrate, followed by formation of a gate electrode thereon.

4. A process for producing a semiconductor device, which comprises the steps of:

oxidizing a main surface of a silicon substrate, forming a silicon nitride film on portions of the oxidized silicon substrate, so as to provide a resulting silicon substrate, oxidizing the resulting silicon substrate, removing the silicon nitride film, and after said removing, carrying out a heat treatment at a temperature of 800° C. or higher in an inert atmosphere, which further comprises forming a gate oxide film on the heat-treated silicon substrate, followed by formation of a gate electrode thereon.

5. A process for producing a semiconductor device which comprises forming an element-separating oxide film on a silicon substrate, and thereafter carrying out a heat-treatment at a temperature of not lower than 800° C. while keeping a surface of the oxide film or silicon substrate in a bare state in an inert atmosphere, followed by formation of a gate oxide film, introduction of impurities, formation of electrodes and wiring, and formation of an insulating film so as to form a transistor, wherein the heat-treatment is carried out while keeping the oxide film or surface of silicon substrate in a bare state after removal of an oxidation-preventing film.

6. The process according to claim 1, wherein the thermal oxide film is formed using an oxidation-preventing film as a mask for selectively forming the thermal oxide film, said oxidation-preventing film being removed after forming the thermal oxide film, and wherein the heat treatment is carried out after removing the oxidation-preventing film.

7. The process according to claim 1, wherein the heat treatment is carried out with the oxide film or the exposed silicon surface in a bare state.

* * * * *